US007652597B2

(12) United States Patent
Kutz et al.

(10) Patent No.: US 7,652,597 B2
(45) Date of Patent: Jan. 26, 2010

(54) MULTIMODE DECODER

(75) Inventors: Gideon Kutz, Ramat Hasharon (IL);
Amir I. Chass, Ramat Hasharon (IL)

(73) Assignee: Freescale Semiconductor, Inc., Austin, TX (US)

( * ) Notice: Subject to any disclaimer, the term of this patent is extended or adjusted under 35 U.S.C. 154(b) by 565 days.

(21) Appl. No.: 10/596,367

(22) PCT Filed: Dec. 13, 2004

(86) PCT No.: PCT/IB2004/004349

§ 371 (c)(1),
(2), (4) Date: Jul. 13, 2006

(87) PCT Pub. No.: WO2005/060107

PCT Pub. Date: Jun. 30, 2005

(65) Prior Publication Data

US 2009/0015448 A1    Jan. 15, 2009

(30) Foreign Application Priority Data

Dec. 11, 2003 (GB) ................................. 0328794.3

(51) Int. Cl.
*H03M 7/00* (2006.01)
(52) U.S. Cl. .............................. 341/82; 341/81; 714/755
(58) Field of Classification Search ............. 341/81–82, 341/94; 714/755
See application file for complete search history.

(56) References Cited

U.S. PATENT DOCUMENTS 6,166,667 A * 12/2000 Park ............................ 341/94
7,127,664 B2 * 10/2006 Nicol et al. .................. 714/792
7,149,951 B2 * 12/2006 Seo ............................. 714/786
7,269,777 B2 * 9/2007 Becker et al. ................ 714/755
2002/0129317 A1    9/2002 Nicol et al.
2003/0018942 A1    1/2003 Seo

FOREIGN PATENT DOCUMENTS

EP    1204210 A1    5/2002
EP    1471677 A1    10/2004

OTHER PUBLICATIONS

Bickerstaff et al; "A Unified turbo/Viterbi Channel Decoder for 3GPP Mobile Wireless in 0.18'mu!m CMOS"; IEEE Journal of Solid-State Circuits, vol. 37, No. 11, Nov. 2002, pp. 1555-1564.
Fan-Min Li et al; "Triple-Mode MAO/VA Timing Analysis for Unified Convolutional/Turbo Decoder Design"; IEEE Workshop Signal processing Systems, USA, Oct. 2004, pp. 280-285.
Huang et al; "VLSI Design of Dual-Mode Viterbi/Turbo Decoder for 3GPP"; 2004 International Symposium Circuits and Systems, canada, May 2004, vol. 2, pp. 773-776.
Chien-Ching Lin et al; "A dual mode channel decoder for 3GPP2 mobile wireless communications"; 30th European Leuven, Solid State Circuits Conference, Belgium, 2004, pp. 483-486.

* cited by examiner

*Primary Examiner*—Khai M Nguyen

(57) ABSTRACT

A decoder comprising a decoding element arranged to operate in a first mode for decoding a turbo encoded data stream and in a second mode for decoding a viterbi encoded data stream, wherein the decoding element is responsive to a first control signal for switching from the first mode to the second mode during decoding of a turbo code block and responsive to a second control signal for switching from the second mode to the first mode to allow continued decoding of the turbo code block.

17 Claims, 3 Drawing Sheets

MULTIMODE DECODER

CROSS-REFERENCE TO RELATED APPLICATIONS

This application claims the benefit of United Kingdom patent application no. 0328794.3. and PCT Application PCT/IB2004/004349 filed Dec. 13, 2004.

FIELD OF THE INVENTION

The present invention relates to a decoder.

BACKGROUND OF THE INVENTION

Wireless communication systems are widely deployed to provide various types of communications such as voice and data. One such system is wideband code division multiple access WCDMA, which has been adopted in various competing wireless communication standards, for example $3^{rd}$ generation partnership project 3GPP and 3GPP2.

To overcome data corruption that can occur during RF transmission the different wireless communication standards typically include some form of channel coding. For example, WCDMA standards typically require that a WCDMA receiver decode a mixture of turbo encoded and viterbi encoded data streams, where viterbi encoded channels are typically used for time critical data.

In particular the 3GPP standard has specified a high speed data packed access HSDPA sub-system that has two physical channels in the downlink direction; a data channel and a control channel in which turbo coding is used to encode the data channel and convolutional coding is used to encode the control channel.

A turbo encoder uses a first convolutional encoder to encode information bits (i.e. systematic bits) within a packet to generate a first sequence of parity bits (i.e. parity 1 bits) in parallel to the interleaver shuffling the information bits, where the shuffled information bits are encoded by a second encoder to generate a second sequence of parity bits (i.e. parity 2 bits). The information bits and the parity bits in the first and second sequence are then modulated and transmitted to a receiver.

The information bits and the first and second sequence of parity bits are received by a receiver and decoded by a turbo decoder.

For turbo encoded data a turbo decoder initially stores the received information bits and the parity bits in the first and second sequence in a buffer. Initially, the information bits and the first sequence of parity bits from the first convolutional encoder are retrieved from the buffer and decoded by a first decoder (i.e. a first soft in soft out SISO decoder), using a log-MAP algorithm, to provide 'extrinsic' information (i.e. a-posteriori data) indicative of adjustments in the confidence in the detected values for the information bits. Intermediate results (i.e. a-priori) that include the extrinsic information from the first decoder are then stored in the buffer in an interleaved order matching the code interleaving used at the transmitter.

The intermediate results, the information bits and the second sequence of parity bits from the second encoder are retrieved from the buffer and decoded by a second decoder (i.e. a second SISO decoder) to provide extrinsic information indicative of further adjustments in the confidence in the detected values for the information bits. Intermediate results that comprise the extrinsic information from the second decoder (i.e. a second SISO decoder) are then stored in the buffer in a deinterleaved order complementary to the code interleaving performed at the transmitter. The intermediate results are used in a next decoding iteration performed by the turbo decoder. The turbo decoder performs a predetermined number of decoding iterations before producing a decision on the value of the decoded information bit.

A viterbi decoder is used to decode convolutional encoded data using a viterbi algorithm.

The basic transmission unit in a HSDPA sub-system is called a time transmission interval TTI where each TTI spans 2ms and contains three identical time periods called slots.

As shown in figure 1, for each TTI transmitted in the data channel 100 there is a corresponding TTI in the control channel 200 that starts 2 slots before the beginning of the associated data channel TTI.

The control data is divided into two parts. The first part 102, which contains information required for the demodulation of the corresponding data channel TTI, is transmitted in the first slot of the control channel TTI. The second part 103, which contains data required for the channel decoding of the corresponding data channel TTI, is transmitted in the second and third slots of the control channel TTI.

There is a period of one slot to decode the first part of the control channel before the decoded data is required for the demodulation of the data channel. Similarly, there is a two slot period to decode the second part of the control channel before the decoded data is required for decoding of the data channel. This arrangement results in severe timing restrictions on the decoding of the control channel part.

One solution to this problem has been the use of a separate turbo decoder for decoding the turbo encoded channels and a separate viterbi decoder for decoding the convolutional encoded channels; however this results in increased cost and size of a receiver.

It is desirable to improve this situation.

BRIEF SUMMARY OF THE INVENTION

This provides the advantage of allowing a single decoder to support the decoding of a turbo encoded channel and a convolutional encoded channel.

BRIEF DESCRIPTION OF THE DRAWINGS

An embodiment of the invention will now be described, by way of example, with reference to the drawings, in which.

DESCRIPTION OF PREFERRED EMBODIMENT(S)

Figure 1:
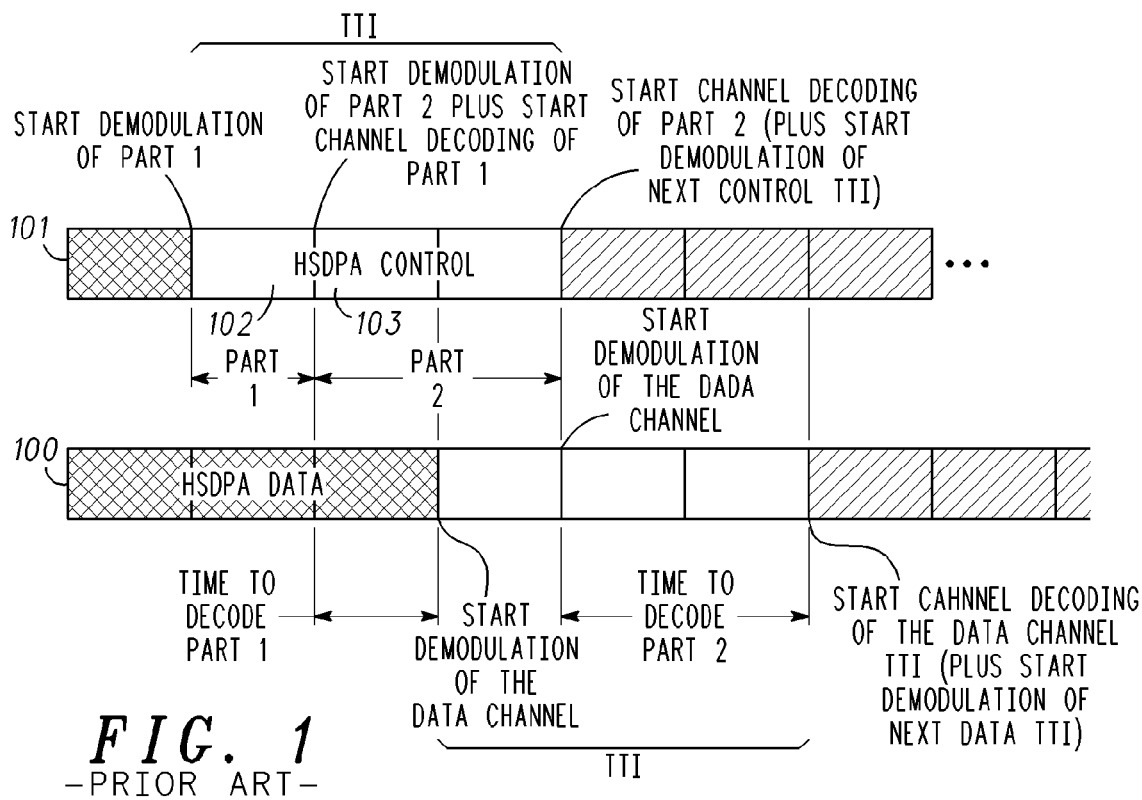
FIG. 1 illustrates the structure of a known HS-DPA data channel and control channel.
Figure 2:
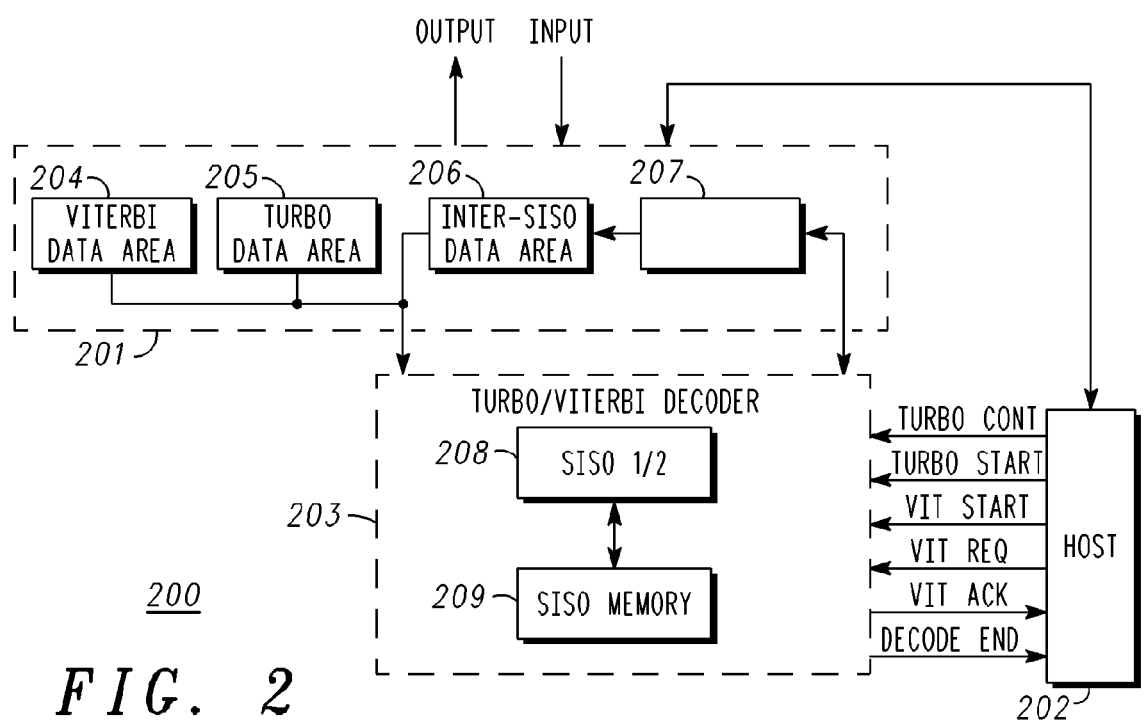
FIG. 2 illustrates a WCDMA receiver according to an embodiment of the present invention.

FIG. 2 shows a WODMA receiver 200 having a memory module 201 (e.g. a buffer), a controller 202 and a decoder 203.

The memory module 201 has a first input for receiving encoded data, a second input for receiving decoded data from the decoder 203, a first output for outputting decoded data, and a second output for providing stored data to the decoder 203. Additionally, the memory module 201 is coupled to the controller 202 to allow the controller 202 to control the flow of data into and out of the memory module 201.

The memory module 201 has four storage areas 204, 205, 206, 207; one storage area 204 for storing received viterbi encoded data (e.g. encoded data received from the HS-DPA control channel), a second storage area 205 for storing received turbo encoded data (e.g. encoded data received from the HS-DPA data channel), a third storage area 206 for storing decoded data received from the decoder, and a fourth storage area 207 for storing viterbi decoded data.

The decoder 203, which is described in detail below, includes a decoding module 208 arranged to support the decoding of both turbo encoded data and convolutional encoded data and an internal memory module 209, where the internal memory module 209 is relatively small with a relatively high bandwidth. The decoding module 208 is arranged to function as a soft input soft output SISO decoder when performing turbo decoding and a hard decoder when performing viterbi decoding.

The decoder 203 is coupled to the controller 202 via a control line to allow the controller 202 to control the operation of the decoder.

An example of the decoding of turbo encoded data and viterbi encoded data will know be described.

The controller 202 initiates the loading of received turbo encoded data into the second storage area 205 of the memory module 201 and starts the turbo decoding process by issuing a 'turbo start' command to the decoder 203. The decoder 203 retrieves systematic bits and the parity 1 bits from the memory module 201 and performs a SISO turbo decoding stage, which corresponds to the first decoder process in a turbo decoder, to generate 'extrinsic' information (i.e. a-posteriori data), which is stored in the third storage area 206 of the memory module 201. The decoder 203 then retrieves the extrinsic information, which is read out in an interleaved order to provide a-prior data, the systematic bits and the parity 2 bits from the memory module 201 and performs a SISO turbo decoding stage, which corresponds to the second decoding process, thereby completing one turbo decoding iteration. The results from this SISO turbo decoding iteration are stored in the third storage area 206 of the memory module 201.

When part 1 of the HSDPA control channel has been received the controller 202 issues a 'viterbi request' command to the decoder 203. In response the decoder 203 finishes the SISO turbo decoding stage that is currently being processed and notifies the controller 202, via a 'viterbi acknowledge' command, when the SISO turbo decoding stage has been complete, while storing the 'extrinsic' data in the third storage area 206 in the memory module 201.

The controller 202 initiates the loading of received convolutional encoded data into the first storage area 204 of the memory module 201 and starts the viterbi decoding process by issuing a 'viterbi start' command to the decoder 203. The decoder 203 retrieves the viterbi encoded data from the first storage area 204 and performs viterbi decoding. When the decoder 203 has completed the viterbi decoding the decoder 203 notifies the controller 202, via a 'decode end' command, and the decoded viterbi data is stored in the fourth storage area 207 of the memory module 201.

The controller 202 then instructs the decoder 203 to continue the decoding of the turbo encoded data (i.e. instructs the decoder 203 to continue performing decoding iterations on the data stored in the third storage area 206 of the memory module 201), via a 'turbo continue' command. The decoder 203 retrieves the data stored in the third storage area 206 of the memory module 201 and continues the turbo decoding process from the last SISO turbo decoding stage performed.

When all the turbo decoding iterations have been complete for a given data slot the decoder 203 notifies the controller 202, via a 'decode end' command, and the decoded data is stored in the third storage area 206 for further processing by other modules (not shown) within the receiver.

If further encoded data within HSDPA data channel slots is available the controller 202 initiates the loading of the received turbo encoded data into the second storage area 205 of the memory module 201 and initiates the turbo decoding process, as described above.

When part 2 of the HSDPA control channel is received the controller 202 initiates the decoding of this data, as described above.

The switching of the decoder 203 between turbo decoding of the data channel and viterbi decoding of the control channel is arranged to continue while the HSDPA data and control channels are being received.

Figure 3:
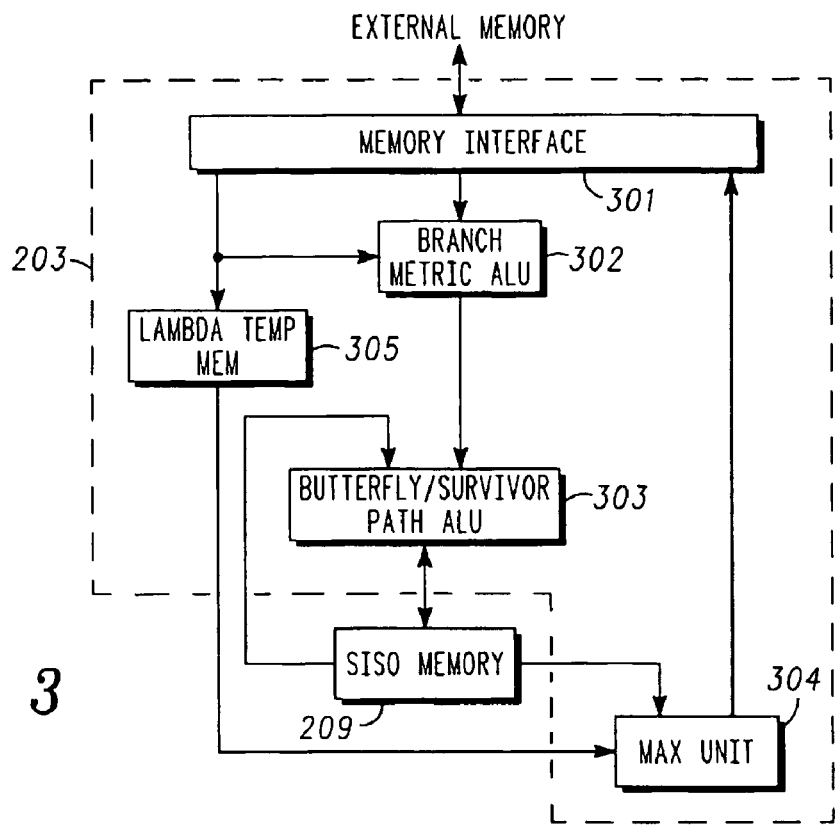
FIG. 3 illustrates a decoder according to an embodiment of the present invention.

FIG. 3 shows the decoder 203 and the memory module 209. The decoder 203 includes a memory interface 301, a branch metric arithmetic logic unit ALU 302, a butterfly/survivor path ALU 303 arranged to calculate 4 butterflies in a single cycle, a MAX unit 304 and a temporary memory 305.

The memory interface 301 is used to interface the decoder 203 to the memory module 201 with the branch metric ALU 302, the MAX unit 304 and the temporary memory 305 being coupled to the memory interface 301. The branch metric ALU 302 is also coupled to the butterfly/survivor path ALU 303, which in turn is coupled to the internal memory module 209. The MAX unit 304 is also coupled to the internal memory module 209 and the temporary memory 305.

During the decoding process the branch metric ALU 302 receives encoded data from the memory module 201 via the memory interface 301. For example, during turbo decoding turbo encoded data is received from the second storage area 205 of the memory module 201 and during viterbi decoding convolutional encoded data is received from the first storage area 204 of the memory module 201.

The branch metric ALU 302 performs branch metric calculations on the received encoded data and provides the calculated branch metrics to the butterfly/survivor path ALU 303.

During turbo decoding the butterfly/survivor path ALU 303 calculates forward recursion state metrics (i.e. alphas $\alpha$) and backward recursion state metrics (i.e. betas $\beta$) while during viterbi decoding the butterfly/survivor path ALU 303 calculates path metrics and updated survivor path metrics. The number of code states for turbo codes and viterbi codes will typically be different, for example for the HSDPA channel there are 8 states for turbo codes (i.e. the constraint length for the turbo code is 4) and 256 states for viterbi codes (i.e. the constraint length for the viterbi code is 9). This is supported by the butterfly/survivor path ALU 303 by the butterfly/survivor path ALU 303 calculating 8 states of a turbo code in parallel in 1 cycle and 256 states of a viterbi code in 32 cycles (i.e. 8 states in parallel 32 times). As described below, the internal memory module 209 is used to allow the butterfly/survivor path ALU 303 to divide the path metric calculation over 32 cycles by storing both the old and new path metrics in memory (i.e. the path metrics for the previous and current cycle).

The butterfly/survivor path ALU 303 results are stored in the internal memory module 209. The internal memory module 209 within this embodiment is configured to have two separate modules, where each module has its own address bus, thereby allowing memory accesses to different addresses between the two modules within a single clock cycle. For the purposes of this embodiment the first module has been designated memory group A and the second module has been designated memory group B. Each memory group is one kilobyte in size having 64 lines (i.e. memory addresses) of 16 bytes each, as described below. The internal memory module 209 is small and can be regarded as a window to a code segment stored in the memory module 201, where the decoding of the code segment is effectively a series of decoding operations on the window data where the window 'slides' over the code segment.

The internal memory module 209 is arranged to store path metrics for a previous cycle, when the decoder 203 is in viterbi mode, which is feedback to the butterfly/survivor path ALU 303 to allow the path metrics for the next cycle to be calculated. When the decoder 203 is in turbo mode, the internal memory module 209 is arranged to store all the state metrics of one window for use by the MAX* unit 304.

Once the decoder 203 has performed the decoding of the states in viterbi decoding the calculated survivor path metrics for the received convolutional encode data is passed from the internal memory 209 through the MAX unit 304 and stored in the fourth storage area 207 of the memory module 201.

When the decoder 203 is performing turbo decoding the calculated forward recursion state metrics and backward recursion state metrics are passed to the MAX unit 304, via the internal memory module 209. Additionally, the temporary memory 305 is used to store extrinsic information that is read out of the third storage area 206 in interleaved order (i.e. a-priori data) which is also provided to the MAX unit 304 to allow the MAX unit 304 to determine new a-posterior data for the current SISO turbo decoding stage. The a-posterior data calculated by the MAX unit 304 is stored in the third storage area 206 of the memory module 201.

As described above, the decoder 203 can be controlled to switch between turbo decoding and viterbi decoding, however, as the contents of the internal memory module 209 are written over when switching from one decoding mode to another decoding mode the switching from one decoding mode to another decoding mode only occurs once a SISO decoding stage has been complete and the SISO decoding stage results have been stored in the memory module or viterbi decoding has been complete.

Figure 4:
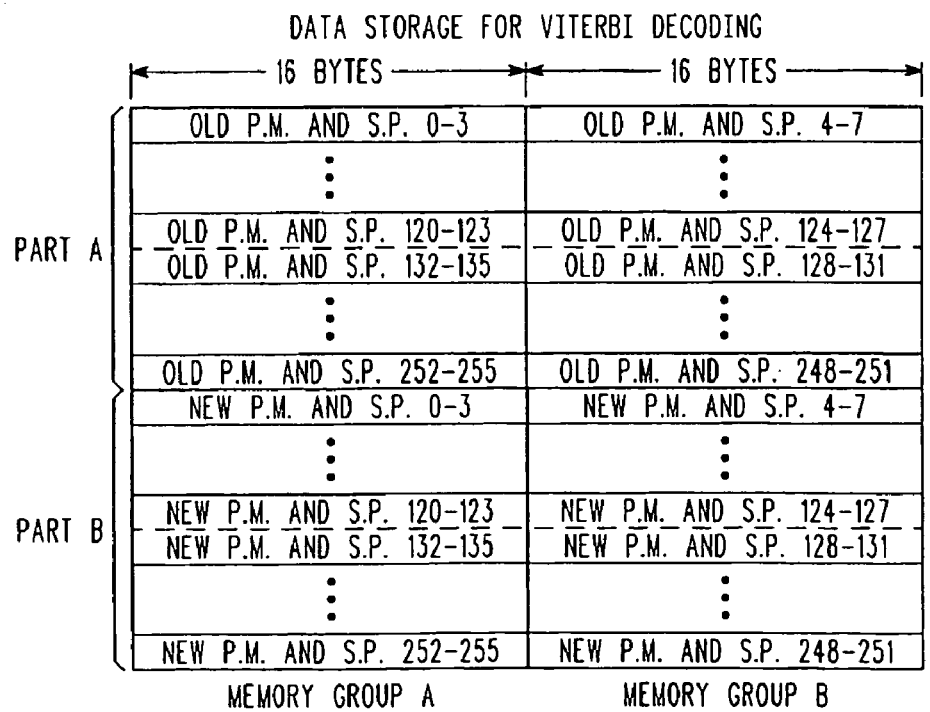
FIG. 4 illustrates a first memory structure according to an embodiment of the present invention.

FIG. 4 illustrates the data storage within the internal memory module 209 when being used for turbo decoding. Memory group A and memory group B together are used to store 128 turbo decoding stages, where a stage corresponds to the 8 state metrics of a turbo code trellis (i.e. the forward recursive metrics or backward recursive metrics calculated by the butterfly/survivor path ALU).

For each cycle two stages of data is read or written from/to the memory.

Figure 5:
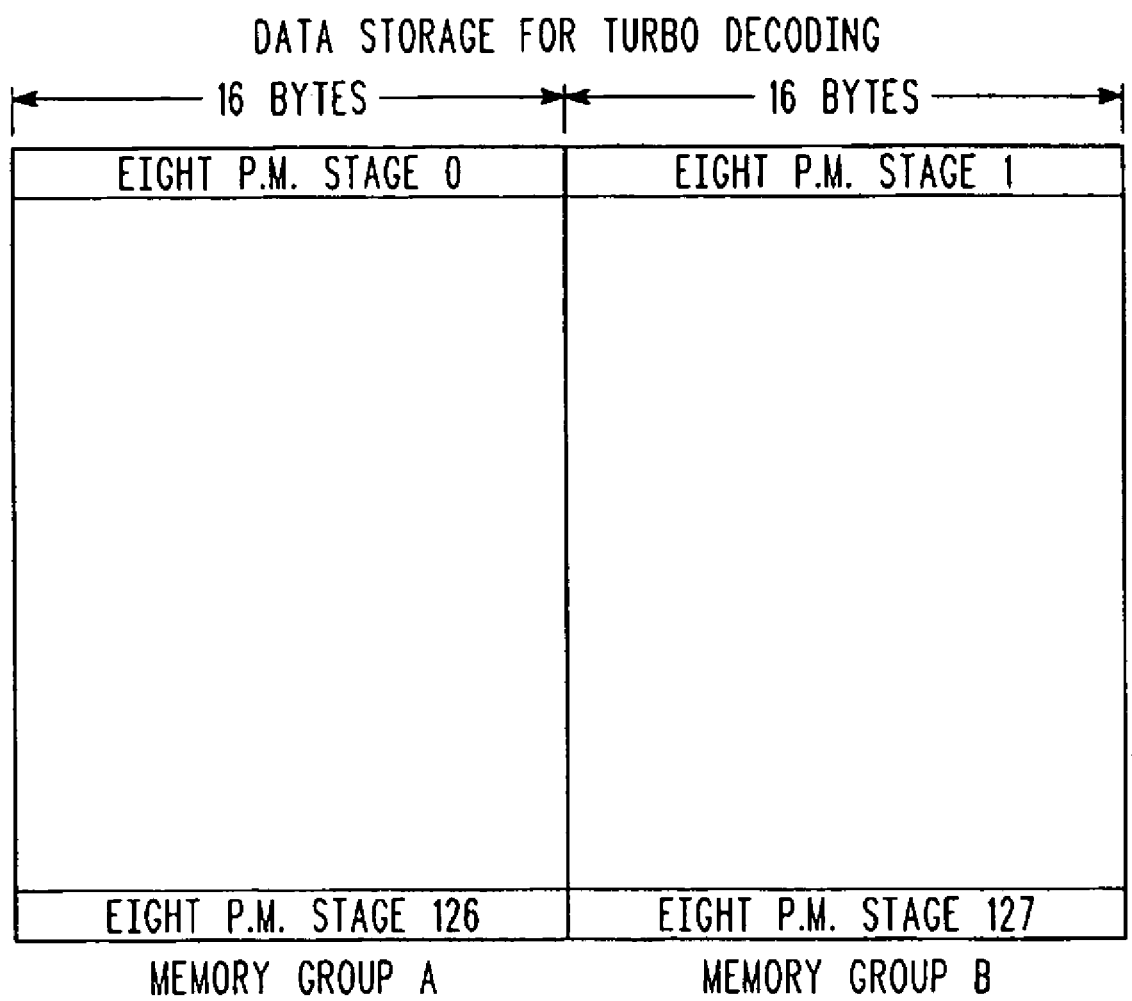
FIG. 5 illustrates a second memory structure according to an embodiment of the present invention.

FIG. 5 illustrates the data storage within the internal memory module 209 when being used for viterbi decoding. As the butterfly/survivor path ALU 303 is arranged to calculate four butterflies in a single cycle (i.e. eight states of the 256 states) the internal memory module is divided into two parts, part A of group A, part B of group B and part A of group B, part B of group A, to avoid corrupting stage i−1 data stored in the internal memory module with the results of the stage i data, until all the states of stage i have been calculated.

For example, the path metrics and survivor paths calculated by the butterfly/survivor ALU 303 for the current stage are read from the part A of group A, part B of group B having been written in during calculation of the previous stage, where the inputs for the first cycle butterflies correspond to i=0, i=1, i=2, i=3, where i takes values from 0 to 127 (i.e. 128 butterflies) and the input states read from memory are states 0 to 3 and 128 to 131. The new path metrics and survivor path calculations generated by the butterfly/survivor path ALU 303 are written to part A of group B, part B of group A and correspond to states 0 to 3 and 4 to 7. During calculations for the next stage the roles of part A of group A, part B of group B and part A of group B, part B of group A of the internal memory module 209 are exchanged (i.e. part A of group A, part B of group B is used for writing the next stage and part A of group B, part B of group A is used to read the current stage data). This process continues until the 256 states have been calculated. With this ordering each read and write operation will involve 4 states from part A of group A, part B of group B and four from part A of group B, part B of group A. Thus, the ordering of the states within the two memory groups allows data to be read from each of the two memory groups or to be written to each of the two memory groups in a single cycle.

It will be apparent to those skilled in the art that the disclosed subject matter may be modified in numerous ways and may assume many embodiments other than the preferred forms specifically set out as described above, for example the decoder could be configured to have one ALU for performing forward recursion and another ALU for performing backward recursion such that the two operations could be performed in parallel.

The invention claimed is:

1. An apparatus including a decoder comprising:
a decoder arranged to operate in a first mode for decoding a turbo encoded data stream and in a second mode for decoding a viterbi encoded data stream, wherein:
the decoder is responsive to a first control signal from a controller for switching from the first mode to the second mode during decoding of a turbo code block so as to interrupt decoding of the turbo code block and responsive to a second control signal for switching from the second mode to the first mode to allow continued decoding of the turbo code block, thereby resuming decoding of the turbo code block.

2. An apparatus according to claim 1, wherein the decoder is arranged to store data generated during the decoding of the turbo code block.

3. An apparatus according to claim 2, wherein the decoder is arranged to retrieve the stored data generated during the decoding of the turbo code block to allow continued decoding of the turbo code block.

4. An apparatus according to claim 1, wherein the decoder is arranged to switch from the first mode to the second mode after an iteration of the decoding of the turbo code block has been completed.

5. An apparatus according to claim 1, wherein the decoder comprises a first logic element that is arranged to calculate forward recursion/backward recursion metrics for a turbo encoded data stream when the decoder is operating in the first mode and to calculate path metrics and survivor path metrics for a viterbi encoded data stream when the decoder is operating in the second mode.

6. An apparatus according to claim 5, wherein the decoder further comprises a second logic unit that is arranged to calculate a posteriori data for a turbo encoded data stream using the forward recursion/backward recursion metrics generated by the first logic unit.

7. An apparatus according to claim 6, wherein the decoder is arranged to switch from the first mode to the second mode after an iteration of the decoding of the turbo code block has been completed.

8. An apparatus according to claim 6, wherein the decoder further comprises a memory to store data generated during the decoding of the turbo code block.

9. An apparatus according to claim 6, wherein the decoder further comprises a memory that is arranged to store forward recursion/backward recursion metrics generated by the first logic unit when the decoder is operating in the first mode and to store path metrics and survivor path metrics generated by the first logic unit when the decoder is operating in the second mode.

10. An apparatus according to claim 9, wherein the decoder is arranged to switch from the first mode to the second mode after an iteration of the decoding of the turbo code block has been completed.

11. An apparatus according to claim 5, wherein the decoder further comprises a memory that is arranged to store forward recursion/backward recursion metrics generated by the first logic unit when the decoder is operating in the first mode and to store path metrics and survivor path metrics generated by the first logic unit when the decoder is operating in the second mode.

12. An apparatus according to claim 5, wherein the decoder further comprises a memory to store data generated during the decoding of the turbo code block.

13. An apparatus according to claim 5, wherein the decoder is arranged to switch from the first mode to the second mode after an iteration of the decoding of the turbo code block has been completed.

14. An apparatus according to claim 5 wherein the decoder is arranged to store data generated during the decoding of the turbo code block.

15. An apparatus according to claim 14 wherein the decoder is arranged to retrieve the stored data generated during the decoding of the turbo code block to allow continued decoding of the turbo code block.

16. An apparatus according to claim 1, wherein the decoder further comprises a memory to store data generated during the decoding of the turbo code block.

17. An apparatus according to claim 16, wherein the decoder is arranged to retrieve the stored data from the memory generated during the decoding of the turbo code block to allow continued decoding of the turbo code block.

* * * * *